United States Patent [19]

Fognini

[11] Patent Number: 4,737,659
[45] Date of Patent: Apr. 12, 1988

[54] CONTROLLED SWITCHING ARRAY

[75] Inventor: Bruno Fognini, Zürich, Switzerland

[73] Assignee: Siemens-Albis Aktiengesellschaft, Zürich, Switzerland

[21] Appl. No.: 3,473

[22] Filed: Jan. 15, 1987

[30] Foreign Application Priority Data

Jan. 27, 1986 [CH] Switzerland ............... 00302/86

[51] Int. Cl.$^4$ .................. H04Q 11/04; H05K 1/00
[52] U.S. Cl. .................... 307/112; 307/149; 370/58; 361/414; 361/405
[58] Field of Search ............... 307/34–41, 307/112; 361/397, 398, 392, 386, 400, 401, 404, 405, 406, 408, 409, 410, 411, 412, 413, 414, 415, 416, 421; 174/52 FP; 370/53, 54, 56, 57, 58, 65, 67, 66; 339/18 R, 17 F

[56] References Cited

U.S. PATENT DOCUMENTS

| 3,504,188 | 3/1970 | Flicker. | |
|---|---|---|---|
| 4,352,994 | 10/1982 | Inzoli et al. | 307/149 |
| 4,420,832 | 12/1983 | Salle et al. | 370/58 X |
| 4,423,468 | 12/1983 | Gatto et al. | 361/408 X |
| 4,425,640 | 1/1984 | Philip et al. | 370/58 |
| 4,489,412 | 12/1984 | Duplessis et al. | 370/58 |
| 4,491,944 | 1/1985 | Caizergues et al. | 370/58 |
| 4,495,546 | 1/1985 | Nakamura et al. | 361/413 X |
| 4,550,398 | 10/1985 | Belforte et al. | 370/66 |
| 4,567,543 | 1/1986 | Miniet | 361/414 X |
| 4,587,649 | 5/1986 | Maddern | 370/58 |
| 4,651,416 | 3/1987 | DePaul | 361/405 X |
| 4,659,931 | 4/1987 | Schmitz et al. | 361/414 X |

FOREIGN PATENT DOCUMENTS 0056949 8/1982 European Pat. Off. .
2113046 7/1983 United Kingdom .

Primary Examiner—William M. Shoop
Assistant Examiner—Paul Ip
Attorney, Agent, or Firm—Werner W. Kleeman

[57] ABSTRACT

The controlled switching array comprises four commutator components and four associated signal distributors. Each signal distributor has an input side to which an input signal is applied which, in turn, is fed to a respective input on the input sides of the commutator components. The commutator components are symmetrically arranged on both sides of a printed circuit board. There thus results a favorable decoupling of signal lines from each other as well as from the output side.

6 Claims, 2 Drawing Sheets

CONTROLLED SWITCHING ARRAY

BACKGROUND OF THE INVENTION

The present invention broadly relates to a new and improved construction of a controlled switching array.

In its more particular aspects the present invention specifically relates to a new and improved construction of a controlled switching array for switching through or commutating input signals which are applied to an input side of a commutator or switching component in the controlled switching array, to the output side of such commutator or switching component.

Controlled switching arrays of such type are frequently employed in order to establish and exchange electrical connections between output terminals of any desired component and input terminals of other components. However, such switching arrays have proven disadvantageous for use at relatively high frequencies with regard to ensuring sufficient decoupling between signal lines which are not momentarily interconnected via a coupling point.

SUMMARY OF THE INVENTION

Therefore, with the foregoing in mind it is a primary object of the present invention to provide a new and improved construction of a controlled switching array which does not exhibit the aforementioned drawbacks and shortcomings of prior art constructions.

It is a further and more specific object of the present invention to provide a new and improved construction of a controlled switching array which ensures sufficient decoupling between signal lines which momentarily are not interconnected.

Now in order to implement these and other objects of the invention which will become more apparent as the description proceeds, the controlled switching array of the present development is manifested by the features that, the switching array contains at least three commutator or switching components associated with at least three signal distributors. Input signals can be applied to the signal distributors and are, in turn, supplied to the respective inputs of the commutator or switching components. At least two commutator or switching components are arranged at least approximately at the same location but on different sides of a printed circuit board.

BRIEF DESCRIPTION OF THE DRAWINGS

The invention will be better understood and objects other than those set forth above will become apparent when consideration is given to the following detailed description thereof. Such description makes reference to the annexed drawings wherein throughout the various figures of the drawings there have been generally used the same reference characters to denote the same or analogous components and wherein.

DETAILED DESCRIPTION OF THE PREFERRED EMBODIMENTS

Figures 1A, 1B:
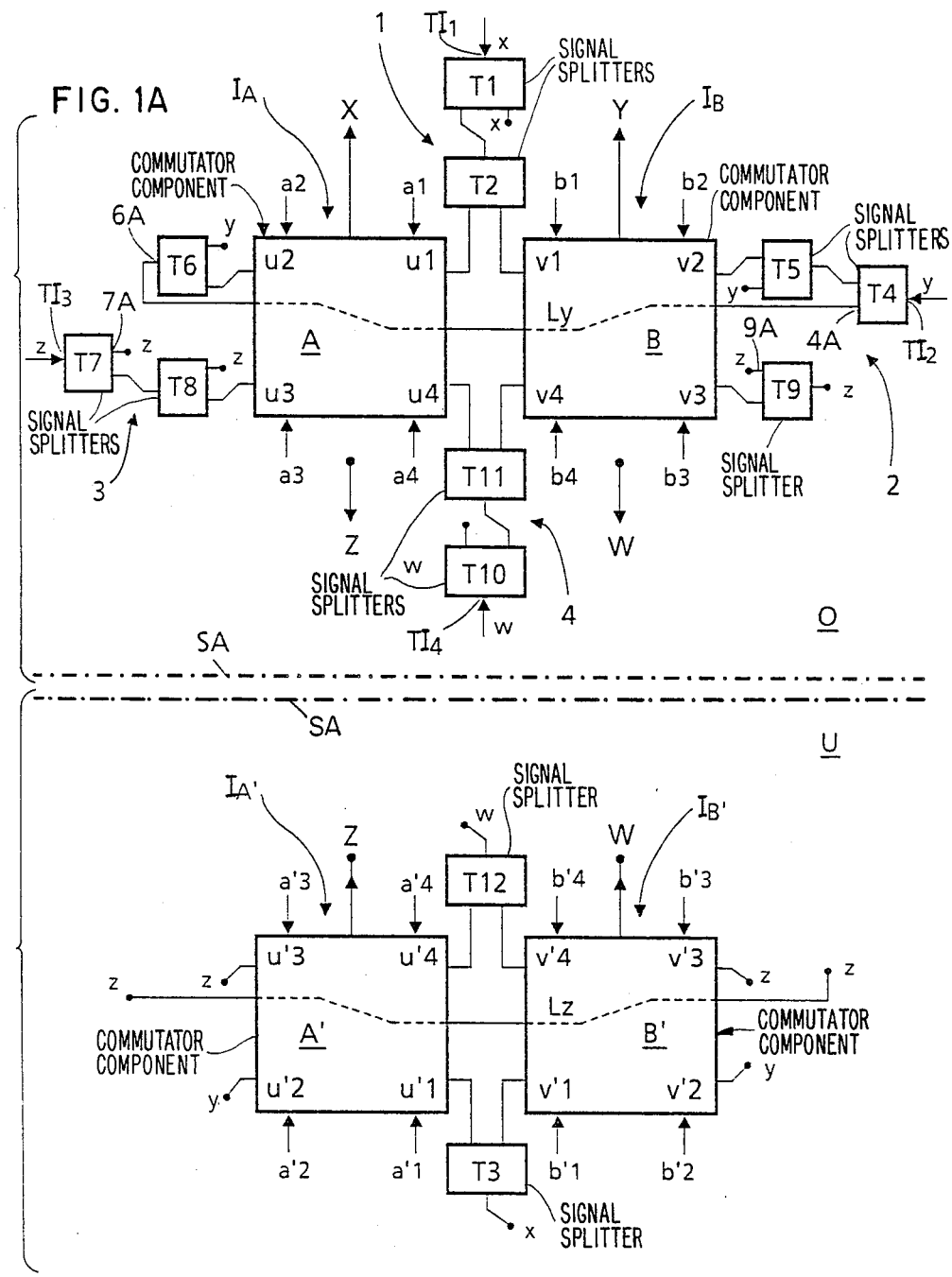
FIGS. 1A and 1B respectively show a diagrammatic view of the top side and the bottom side of a printed circuit board equipped with various commutator or switching components of a first exemplary embodiment of the inventive controlled switching array.

Describing now the drawings, it is to be understood that to simplify the showing thereof, only enough of the structure of the controlled switching array has been illustrated herein as is needed to enable one skilled in the art to readily understand the underlying principles and concepts of the present invention. Turning now specifically to FIGS. 1A and 1B of the drawings, there is illustrated therein a first exemplary embodiment of the inventive controlled switching array containing four commutator or switching components A, B, A, and B', each of which is represented by a quadrangle or box. A first and a second commutator or switching component A and B are arranged on the top side or upper side O (FIG. 1A), and a third and a fourth commutator or switching component A' and B' (FIG. 1B) are exactly oppositely arranged at the bottom side or lower side U of a printed circuit board conveniently symbolized by the axis SA in each of FIGS. 1A and 1B. Therefore, the boxes A and A' and the boxes B and B' in FIG. 1A and FIG. 1B, respectively represent mirror images of each other with respect to axis SA.

In order to maintain low levels of crosstalk between one side O or U and the other side U or O, as the case may be, of a printed circuit board, the commutator or switching components A, B, A', and B' are constructed as surface mounted devices which are fixed in a flat configuration to the printed circuit board and then soldered.

FIGS. 1A and 1B indicate respective control signals a1, a2, a3, a4; b1, b2, b3, b4; a'1, a'2, a'3, a'4 and b'1, b'2, b'3, b'4 for the commutator or switching components A, B, A', and B' and such control signals are fed to appropriate terminals. The commutator or switching component A comprises an input side $I_A$ containing four signal inputs u1, u2, u3, and u4 and one signal output X. The commutator or switching component B also comprises an input side $I_B$ with four signal inputs v1, v2, v3, and v4 and one signal output Y. The commutator or switching component A' likewise comprises an input side $I_A$, with four signal inputs u'1, u'2, u'3, and u'4 and one signal output Z. The commutator or switching component B' comprises an input side $I_B$, with four signal inputs v'1, v'2, v'3, and v'4 and one signal output W.

The controlled switching array according to FIGS. 1A and 1B further comprises four signal distributors 1, 2, 3 and 4 each of which contains three signal splitters. Specifically, there is provided a first signal distributor 1 including the signal splitters T1, T2, and T3 for an input signal x at an input $TI_1$. The second signal distributor 2 includes the signal splitters T4, T5, and T6 and receives an input signal y at an input $TI_2$. The third signal distributor 3 includes the signal splitters T7, T8, and T9 and receives an input signal z at an input $TI_3$. The fourth signal distributor 4 includes the signal splitters T10, T11, and T12 and receives an input signal w at an input $TI_4$. Thus, the input signal x is conducted by means of the first signal distributor 1 to the inputs u1, v1, u'1, and v'1. The input signal y is conducted by means of the second signal distributor 2 to the inputs u2, v2, u'2, and v'2. The input signal z is conducted by means of the third signal distributor 3 to the inputs u3, v3, u'3, and v'3. The input signal w is conducted by means of the fourth signal distributor 4 to the inputs u4, v4, u'4, and v'4.

It is of importance in the embodiment shown in FIGS. 1A and 1B, that an output 4A of the signal splitter T4 comprises a relatively long or extended conductor or wire connector Ly on the top or upper side O of the printed circuit board for connection to an input 6A of the signal splitter T6. Also, an output 7A of the signal splitter T7 is connected via a relatively long or extended conductor track or connecting wire Lz on the bottom or lower side U of the printed circuit board with an input 9A of the signal splitter T9. The conductors or connecting wires Ly and Lz, for instance, may be arranged below the commutator or switching components A and B or A' and B', namely such as to be approximately located at the center of their surfaces, in particular within the space between the commutator or switching components A and B or A' and B'.

The controlled switching array according to FIGS. 1A and 1B functions as follows:

The commutator or switching component A is controlled by the control signals a1, a2, a3 and a4 or as well by less than such four control signals such that either the input signal x from the input u1, the input signal y from the input u2, the input signal z from the input u3 or the input signal w from the input u4 is conducted to the output X. A corresponding situation exists for the other commutator or switching components B, A' and B'. Through-contacts are provided at the outputs Z and W from the bottom or lowerside U to the top or upper side O of the printed circuit board.

Due to this particular construction together with a suitable conductor path or track layout there results the advantage that excellent decoupling is accomplished of the signal conductors from each other and from the output side or outputs X, Y, W and Z.

Figure 2A:
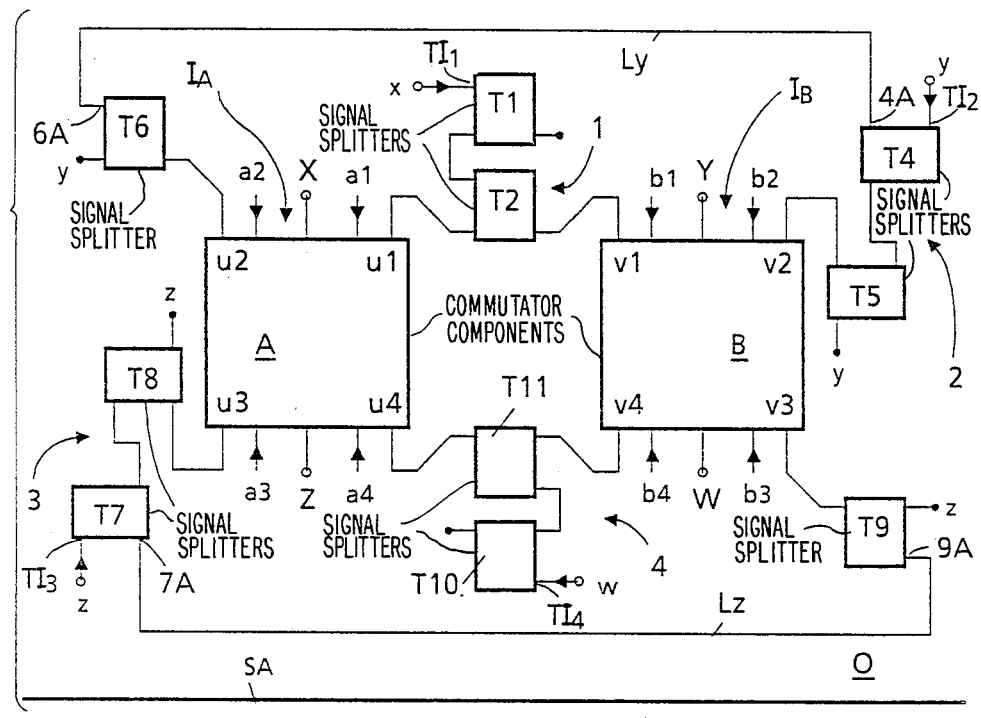
FIGS. 2A and 2B respectively show a diagrammatic view of the top side and the bottom side of a printed circuit board equipped with various commutator or switching components of a second exemplary embodiment of the inventive controlled switching array.
Figure 2B:
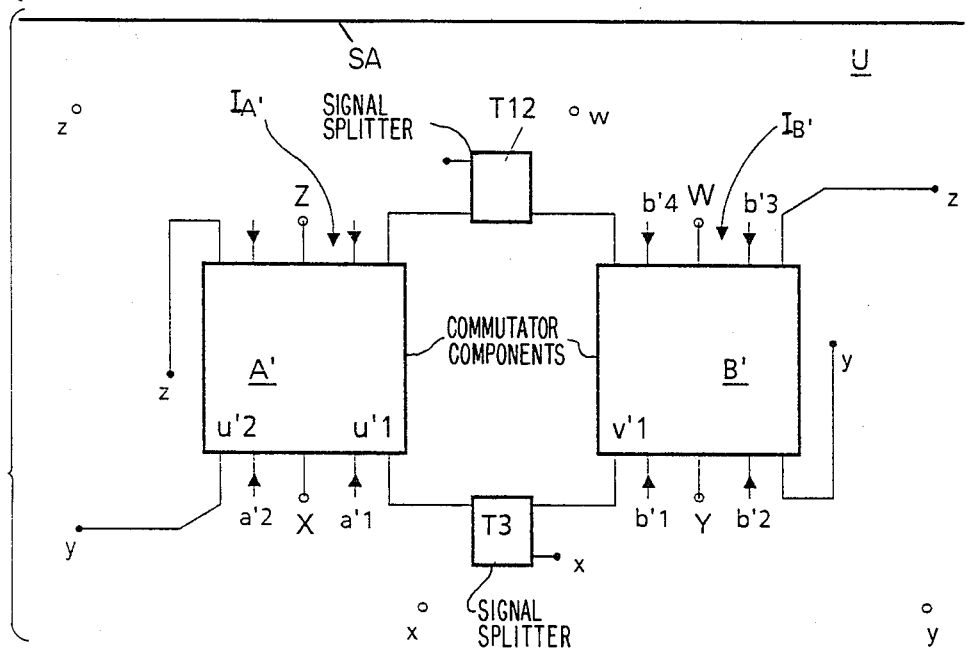

The second embodiment of the inventive controlled switching array shown in FIGS. 2A and 2B has a different arrangement using similar elements as in the first embodiment described hereinbefore with reference to FIGS. 1A and 1B. In this arrangement, however, the conductor or wire connector Ly which connects the output 4A of the signal splitter T4 and the input 6A of the signal splitter T6, is arranged at the greatest possible spacing from all of the elements and, therefore, is located nearly at the edge of the printed circuit board. The same is true for the conductor or connecting wire Lz which connects the output 7A of the signal splitter T7 with the input 9A of the signal splitter T9.

The controlled switching array as shown in FIGS. 1A and 1B or FIGS. 2A and 2B can also operate with only three commutator or switching components, e.g. the commutator or switching components A, B, and A'. In this case the commutator or switching component B and the signal splitters T12, T3, T5 and T9 are omitted such that direct connections must be made between the signal splitter T10 and the input u1, the signal splitter T1 and the input u'1, the signal splitter T7 and the input v3 via the conductor or connecting wire Lz, and the signal splitter T4 and the input v2. It is also possible to provide a conductor or connecting wire like the conductor or connecting wire Ly shown in FIG. 1A or FIG. 2A in combination with a conductor or connecting wire like the conductor or connecting wire Lz shown in FIG. 2B or FIG. 1B.

In a controlled switching array as shown in FIGS. 1A, and 1B or FIGS. 2A, and 2B, the printed circuit board may comprise a multi-layer printed circuit board which contains at least one layer partly comprising a ground plane layer and partly containing conductor guide tracks (micro-strip/co-planar).

The controlled switching array as shown in FIGS. 1A, and 1B or FIGS. 2A, and 2B may also comprise a multi-layer printed circuit board which, for instance, contains a median ground plane layer which, together with an upper and lower layer, forms conductors (strip line) in micro-strip or co-planar technique. The multi-layer printed circuit board also may comprise two ground plane layers and a median or intermediate layer arranged therebetween and containing or carrying the conductors or connecting wires (triplate conductors).

While there are shown and described present preferred embodiments of the invention, it is to be distinctly understood that the invention is not limited thereto, but may be otherwise variously embodied and practiced within the scope of the following claims.

What we claim is:

1. A controlled switching array comprising:
   at least three commutator components, each possessing an input side and an output side;
   at least three signal distributors having respective input sides and being associated with respective ones of said at least three commutator components;
   each one of said at least three signal distributors being capable of being supplied with an input signal on its input side;
   each one of said at least three signal distributors applying its supplied input signal to an associated input on said input side of said associated one of said at least three commutator components;
   a printed circuit board having two different sides;
   at least two of said at least three commutator components being arranged at least approximately at the same location but on said two different sides of said printed circuit board;
   each one of said at least three commutator components switching through said input signal applied to its input side to its output side in a controlled manner;
   at least one of said at least three signal distributors comprises at least two separate signal splitters;
   one of said at least two separate signal splitters being located in proximity to said input side of one of said at least three commutator components;
   an other one of said at least two separate signal splitters being located in proximity to an other one of said at least three commutator components; and
   a conductor for interconnecting said at least two separate signal splitters.

2. The switching array as defined in claim 1, wherein:
   said printed circuit board constitutes a multi-layer printed circuit board.

3. The switching array as defined in claim 2, wherein:
   said multi-layer printed circuit board has arranged therein an intermediate layer constituting a ground plane layer.

4. The switching array as defined in claim 1, wherein:
   said printed circuit board is provided with strip lines.

5. The switching array as defined in claim 2, wherein:
   said multi-layer printed circuit board contains at least one predetermined layer; and
   said predetermined layer partly comprising a ground plane layer and partly containing conductor guide tracks.

6. The switching array as defined in claim 2, wherein:
   said multi-layer printed circuit board contains two ground plane layers and a median layer arranged between said two ground plane layers; and
   said median layer containing conductor tracks.

* * * * *